United States Patent
Krivokapic (12)

(10) Patent No.: US 6,716,706 B1
(45) Date of Patent: Apr. 6, 2004

(54) METHOD AND SYSTEM FOR FORMING A LONG CHANNEL DEVICE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 254 days.

(21) Appl. No.: 09/592,124

(22) Filed: Jun. 12, 2000

(51) Int. Cl.$^7$ .............................................. H01L 21/336
(52) U.S. Cl. ...................... 438/275; 438/279; 438/283
(58) Field of Search ................................ 438/275, 279, 438/283

(56) References Cited

U.S. PATENT DOCUMENTS 6,004,854 A * 12/1999 Dennison et al. ............ 438/306

* cited by examiner

*Primary Examiner*—Long Pham
(74) *Attorney, Agent, or Firm*—Winstead Sechrest & Minick P.C.

(57) ABSTRACT

The present invention is a method of forming a channel device. The method comprises the steps of providing at least one active region on a substrate wherein the active region comprises a plurality of discontinuous gate structures. The method further comprises providing an ion implantation in the substrate. In accordance with the present invention, a higher Early Voltage is achieved thereby enabling halo/pocket and LDD implants to be effectively utilized in the design of analog circuitry.

8 Claims, 6 Drawing Sheets

Providing a single continuous channel gate within an active region on a substrate

10

↓

Providing halo/pocket and LDD implants in the substrate

Substrate

METHOD AND SYSTEM FOR FORMING A LONG CHANNEL DEVICE

FIELD OF THE INVENTION

The present invention relates to analog circuitry and more particularly to a technique for improving the performance of long channel devices.

BACKGROUND OF THE INVENTION

Semiconductor manufacturers have increasingly turned to high-density Metal Oxide Semiconductor (MOS) arrays in their integrated circuit design schemes. To achieve a high-density integrated circuit, features such as metal-oxide semiconductor field-effect transistors (MOSFETs) must be as small as possible. Integrated circuit device geometries well below one micron feature sizes continue to become increasingly common. In general, the use of smaller devices oil integrated circuit chips results in better performance and high packing density, thereby reducing cost while increasing performance. However, with such small feature sizes, device performance is significantly impacted by physical effects which can be largely ignored with larger devices.

Small geometry devices exhibit a severe short channel effect, which manifests as a rapid drop of threshold voltage with decreasing channel length. In order to prevent subsurface leakage between source and drain, which is not controlled by the gate bias, one has to increase the dopant concentration of the channel. The side effect of this is that this dopant increase severely reduces drive currents. In order to avoid this problem halo or pocket implant are used since they don't increase the channel resistance but are strategically placed to raise the potential barrier between the source and drain.

Halo/pocket implants are moderately doped implants of the same conductivity type at the well or substrate in which the transistor is formed, and which lie in a thin layer generally along the source drain to substrate well junctions. A combination of LDD structures and halo pocket implants has proven to achieve good device performance and reliability.

For an illustration of the conventional methodology please refer now to FIG. 1. FIG. 1 is a flowchart illustrating the conventional process steps for utilizing LDD structures and halo/pocket implants in the design of electric circuitry. First, a single continuous channel gate is provided within an active region on a substrate, via step 10. Next, halo/pocket and LDD implants are provided, via step 12. FIG. 2 shows the conventional channel gate structure 20.

Although halo/pocket and LDD implant work well with digital applications, halo/pocket and LDD implants are not suitable for analog applications where the channel gate length exceeds 0.75 μm. This is because long channel gates that have undergone halo/pocket and LDD implants have a significantly smaller Early Voltage which is undesirable for analog circuits.

Early Voltage is a measure of the degree to which the base modulation effect (or Early effect, after the scientist who first correctly explained its basis) impacts the characteristics of a bipolar transistor. A large value of $V_A$ (>100 V) is desired in analog circuits for two reasons:

1. The open-circuit voltage gain, $a_0$ (defined as the small-signal low-frequency voltage gain in the common-emitter configuration), is approximately found from:

$$a_0 = q\, V_A/kT$$

where q is the elementary charge constant, k is the Boltzmann constant and T is temperature. Since $a_0$ is the maximum voltage gain that can be obtained from a biolar transistor, it is a significant parameter in analog circuits. Because the above referenced equation indicates that $a_0$ depends only on $V_A$ and T, a large value of $V_A$ will permit larger voltage gains to be achieved.

2. Since $\Delta V_{CE}/\Delta I_C = V_A/I_C = r_0$ (where $r_0$ is the small-signal output resistance of the transistor in the common-emitter configuration), small values of $V_A$ imply a smaller output resistance, which is generally undesirable. Analog applications therefore require a minimum $V_A$ of 30 volts, while a lower voltage is normally acceptable for digital applications (15–20).

FIG. 3 shows a conventional plot of the Early Voltage. $V_A$, vs. the channel length, $L_{poly}$. As can he seen in FIG. 3, a device with a halo/pocket implant has a substantially lower $V_A$ than a device without a halo/pocket implant.

The halo/pocket implant results in a barrier at both ends of the channel and these barriers inhibit current flow. Increasing the drain voltage has the effect of reducing the barrier at the drain end of the transistor and increasing, the current. This results in a high output conductance value for the analog circuit. Since amplifier gain, G, is measured as $$G = \text{transconductance/output conductance}$$

a high output conductance value results in a low amplifier gain. Consequently, because of the low amplifier gain, it is difficult to design useful analog applications.

Accordingly, what is needed is a system and method that allows for the effective use of halo/pocket and LDD implants in the design of analog circuitry without the aforementioned problems. The system and method should be easy to implement and cost effective. The present invention addresses such a need.

SUMMARY OF THE INVENTION

The present invention is a method of forming a channel device. The method comprises the steps of providing at least one active region on a substrate wherein the active region comprises a plurality of discontinuous gate structures. The method further comprises providing an ion implantation in the substrate.

In accordance with the present invention, a higher Early Voltage is achieved thereby enabling halo/pocket and LDD implants to be effectively utilized in the design of analog circuitry.

BRIEF DESCRIPTION OF THE DRAWINGS

FIG. 1 is a flow chart illustrating the conventional process steps for utilizing LDD and halo/pocket implants in the design of electric circuitry.

DETAILED DESCRIPTION

The present invention relates to a method and system for forming a long channel device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is disclosed in the context of a preferred embodiment. The preferred embodiment of the present invention provides for a method for forming long channel devices in the design of analog circuitry. The method comprises dividing the channel gate into stacked structures of minimum channel length. Furthermore, the divided minimum channel length gates are connected at the metal level to the same gate voltage. Since the channel is inverted only under the stacked structures of minimum channel length, the degradation of the transistor parameters (i.e. threshold voltage, transconductance) is minimized. By minimizing the degradation of the transistor parameters, halo/pocket and LDD implants can be effectively utilized in the design of analog circuitry. Specifically, through the use of the method system in accordance with the present invention, an Early Voltage higher then that of the conventional methodology is achieved thereby improving the performance of the resulting analog circuit.

Figure 2:
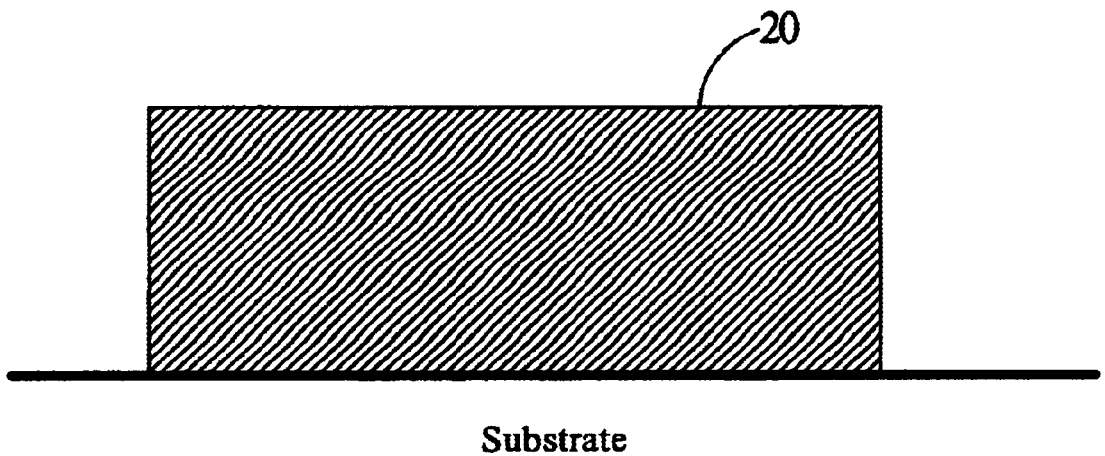
FIG. 2 shows the conventional channel gate structure.
Figure 3:
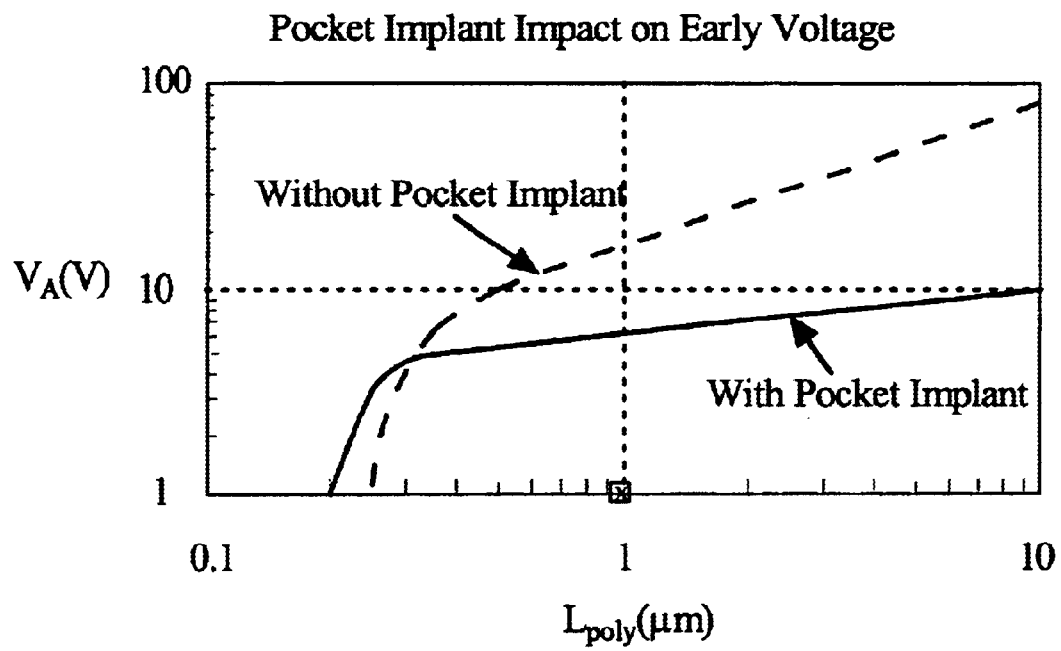
FIG. 3 shows a conventional plot of the Early Voltage, $V_A$, vs. the channel length, $L_{poly}$.
Figure 4:
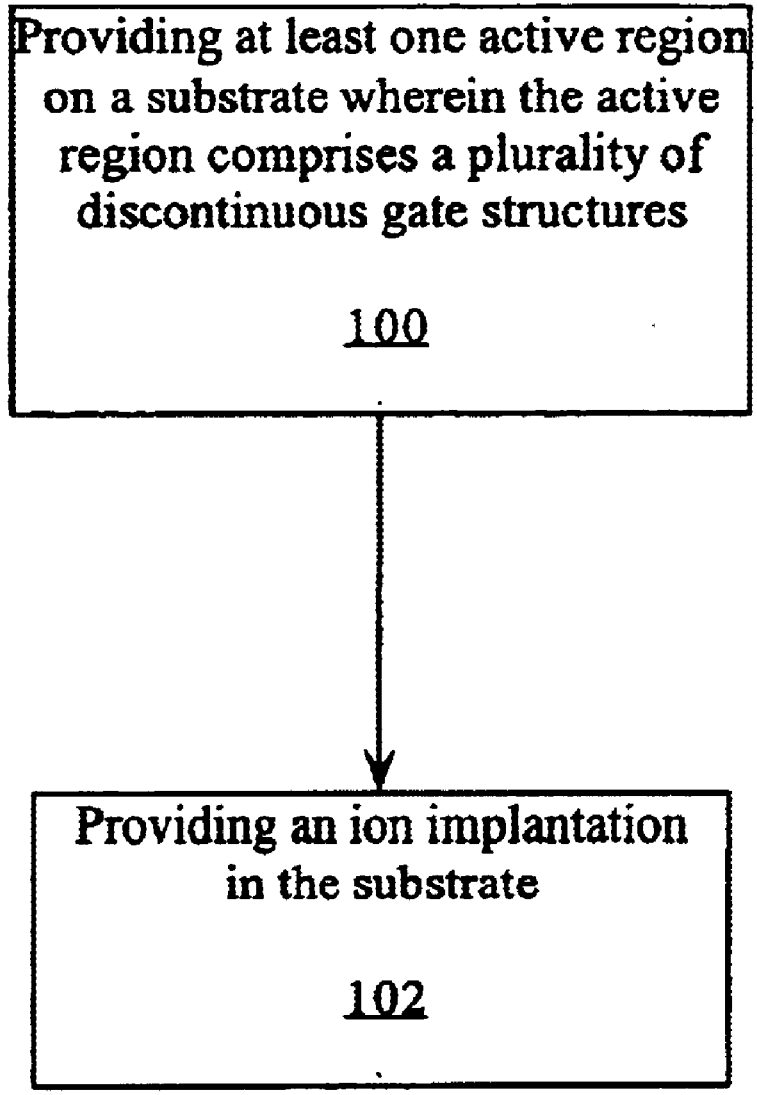
FIG. 4 is a flowchart of the method in accordance with the present invention.

For a better understanding of the method in accordance with the present invention, please refer to the flowchart of FIG. 4. Firstly, at least one active region is provided on a substrate wherein the active region comprises a plurality of discontinuous gate structures, via step 100. The plurality of gate structures comprises three (3) gate structures of minimum channel length with nominal spacing therebetween. These structures are subsequently connected at the metal level to the same gate voltage. Preferably, for the 0.18 μm technology, the minimum gate length is 0.18 μm with a 0.27 μm spacing therebetween and for the 0.13 μm technology, the minimum gate length is 0.13 μm with a 0.2 μm spacing therebetween. Next, ion implantation is provided, via step 102. Preferably, the ion implantation comprises halo/pocket and lightly doped drain implants. Furthermore, the gate structures are preferably masked prior to the performance of the halo pocket LDD implants. Since the channel is inverted only under the stacked structures of minimum channel length, the detrimental effect on the Early Voltage due to the performance of the halo/pocket and LDD implants is substantially reduced.

Figure 5:
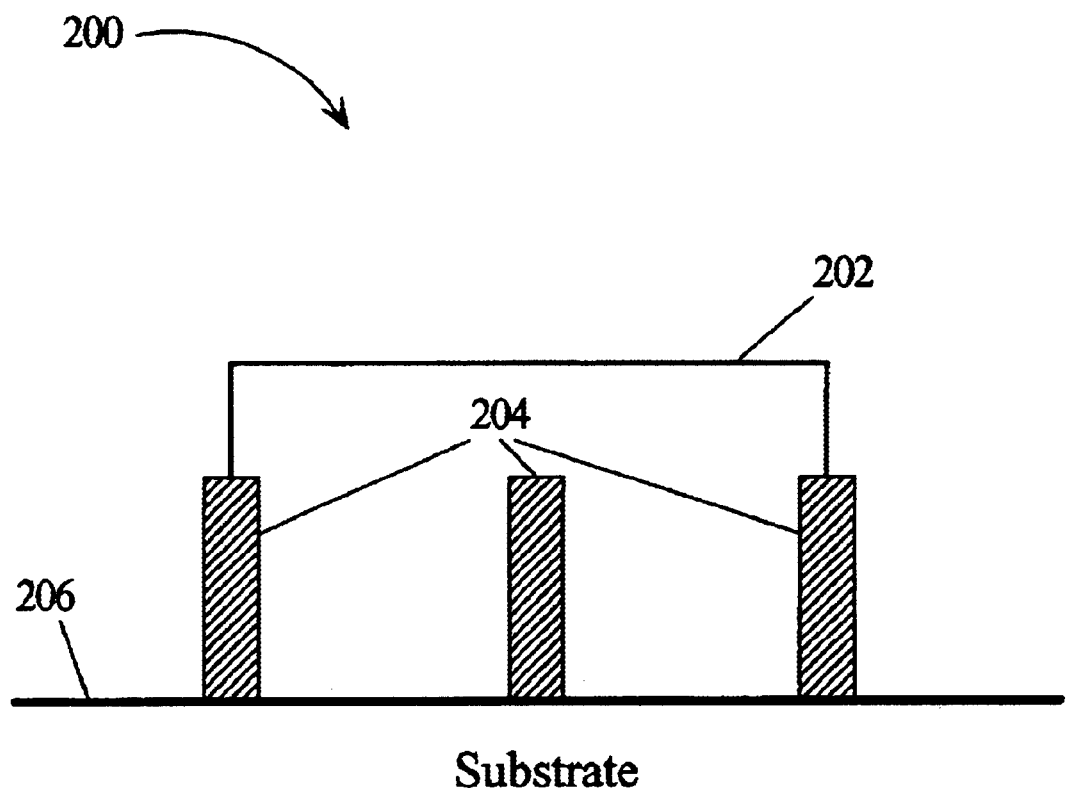
FIG. 5 shows a structure in accordance with the present invention.

For a further illustration of the present invention, please refer to FIG. 5. FIG. 5 shows a structure 200 in accordance with the present invention. The structure comprises a plurality of gate structures 204 of minimal length on a substrate 206. As previously stated, the gate structures 204 are provided with a mask 202 prior to the performance of the LDD and halo/pocket implants.

Figure 6:
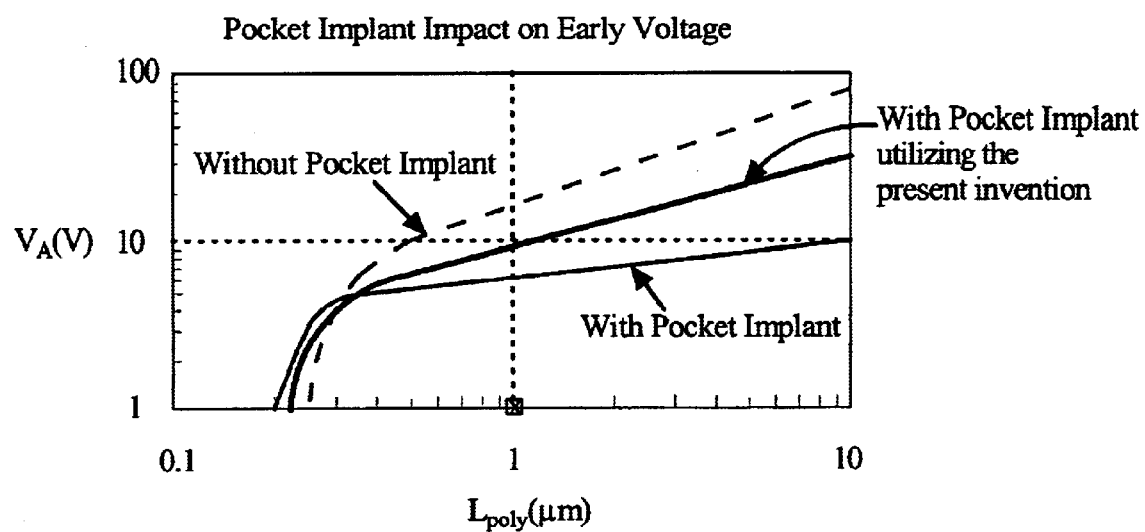
FIG. 6 shows a plot of the Early Voltage, $V_A$, vs. the channel length, $L_{poly}$.

FIG. 6 shows a plot of the Early Voltage, $V_A$, vs. the channel length, $L_{poly}$. As can be seen in FIG. 6, a device with a halo/pocket implant that incorporates the method in accordance with the present invention has a substantially higher $V_A$ than a device with a halo/pocket implant that does not incorporate the method in accordance with the present invention.

Through the use of the method system in accordance with the present invention, the degradation of the transistor parameters (i.e. threshold voltage, transconductance) is minimized. By minimizing the degradation of the transistor parameters, a higher Early Voltage is achieved thereby enabling halo/pocket and LDD implants to be effectively utilized in the design of analog circuitry.

A method and system for forming a channel gate is disclosed. Although the present invention has been described in accordance with the embodiments shown, one of ordinary skill in the art will readily recognize that there could be variations to the embodiments and those variations would be within the spirit and scope of the present invention. Accordingly, many modification may be made by one of ordinary skill in the art without departing from the spirit and scope of the appended claims.

What is claimed is:

1. A system for forming a channel device comprising:
   means for providing an active region on a substrate wherein the active region comprises a plurality of discontinuous gate structures; and
   means for providing an ion implantation in the substrate.

2. The system of claim 1 wherein means for providing the ion implantation further comprises:
   means for masking the plurality of gate structures prior to the ion implantation.

3. The system of claim 2 wherein the active region comprises three gate structures.

4. The method of claim 3 wherein each of the three gate structures comprises a channel length of at least 0.13 μm disposed at least 0.2 μm apart.

5. The system of claim 2 wherein the ion implantation comprises a lightly doped drain implant.

6. The system of claim 5 wherein the ion implantation further comprises a halo implant.

7. The system of claim 5 wherein the ion implantation further comprises a pocket implant.

8. The system of claim 1 wherein each of the plurality of discontinuous gate structures are connected to a gate voltage source.

* * * * *